United States Patent
Koren et al.

(10) Patent No.: US 9,471,232 B2
(45) Date of Patent: Oct. 18, 2016

(54) METHODS OF SANITIZING A FLASH-BASED DATA STORAGE DEVICE

(71) Applicant: SanDisk IL Ltd., Kfar Saba (IL)

(72) Inventors: Rami Koren, Kfar Saba (IL); Eran Leibinger, Kfar Saba (IL); Nimrod Wiesz, Raanana (IL); Eugen Zilberman, Richmond Hill (CA); Ofer Tzur, Ramat Gan (IL); Sagiv Aharonoff, Bney-Brak (IL); Moredechai Teicher, Hod Hahsaron (IL)

(73) Assignee: SanDisk IL Ltd., Kfar Saba (IL)

(*) Notice: Subject to any disclaimer, the term of this patent is extended or adjusted under 35 U.S.C. 154(b) by 0 days.

(21) Appl. No.: 14/582,995

(22) Filed: Dec. 24, 2014

(65) Prior Publication Data
US 2015/0153960 A1  Jun. 4, 2015

Related U.S. Application Data

(60) Continuation of application No. 12/491,210, filed on Jun. 24, 2009, now Pat. No. 8,954,703, which is a continuation of application No. 11/171,382, filed on Jul. 1, 2005, now abandoned, which is a division of application No. 10/449,066, filed on Jun. 2, 2003, now Pat. No. 7,003,621.

(60) Provisional application No. 60/457,021, filed on Mar. 25, 2003.

(51) Int. Cl.
G06F 12/00     (2006.01)
G06F 3/06      (2006.01)
G11C 16/10     (2006.01)
G11C 16/16     (2006.01)

(52) U.S. Cl.
CPC .......... *G06F 3/0619* (2013.01); *G06F 3/0659* (2013.01); *G06F 3/0679* (2013.01); *G11C 16/102* (2013.01); *G11C 16/105* (2013.01); *G11C 16/16* (2013.01); *G06F 2221/2143* (2013.01)

(58) Field of Classification Search
CPC . G06F 3/0619; G11C 16/102; G11C 16/105; G11C 16/16
See application file for complete search history.

(56) References Cited

U.S. PATENT DOCUMENTS

| | | | | |
|---|---|---|---|---|
| 5,459,850 A | * | 10/1995 | Clay | G06F 3/0601 703/24 |
| 5,513,138 A | * | 4/1996 | Manabe | G06K 19/07 365/185.11 |
| 6,216,183 B1 | * | 4/2001 | Rawlins | G06F 21/31 710/100 |
| 6,571,312 B1 | * | 5/2003 | Sugai | G11C 16/16 365/185.29 |

* cited by examiner

Primary Examiner — Gurtej Bansal
(74) Attorney, Agent, or Firm — Martine Penilla Group, LLP

(57) ABSTRACT

A data storage device includes one or more non-volatile, blockwise erasable data storage media and a mechanism for sanitizing the media in response to a single external stimulus or in response to a predetermined physical or logical condition. Optionally, only part of the media is sanitized, at a granularity finer than the blocks of the medium. Setting a flag in an auxiliary nonvolatile memory enables an interrupted sanitize to be detected and restarted. Optionally, a "death certificate" verifying the sanitizing is issued. Preferably, the media are configured in a manner that allows atomic operations of the sanitizing to be effected in parallel.

15 Claims, 4 Drawing Sheets

METHODS OF SANITIZING A FLASH-BASED DATA STORAGE DEVICE

CLAIM OF PRIORITY

This application is a continuation of prior application Ser. No. 12/491,210, filed on Jun. 24, 2009, and entitled "Methods of Sanitizing a Flash-Based Data Storage Device," which is a continuation of application Ser. No. 11/171,382, filed on Jul. 1, 2005 (since abandoned), which is a divisional of application Ser. No. 10/449,066, filed on Jun. 2, 2003, (since issued as U.S. Pat. No. 7,003,621, on Feb. 21, 2006), which claims priority under 35 U.S.C. 119(e) from U.S. Provisional Patent Application No. 60/457,021, filed on Mar. 25, 2003. The disclosure of each above-identified application is incorporated herein by reference.

FIELD AND BACKGROUND OF THE INVENTION

The present invention relates to nonvolatile storage devices and, more particularly, to methods for sanitizing a flash-based data storage device and to a flash-based data storage device particularly adapted to the implementation of these methods.

For as long as data has been stored digitally, there has been a need to erase classified data, from the medium in which they are stored, in a manner that renders the data unrecoverable. Such an erasure is called "sanitizing" the medium.

The most common nonvolatile data storage devices use magnetic data storage media, in which data bits are stored as magnetized regions of a thin ferromagnetic layer. It is difficult to sanitize such a medium. The usual method of sanitizing such a medium is to write over the data many times with different data patterns. This method requires a long time (minutes to hours) to perform, and cannot be guaranteed to render the old data unrecoverable. A sufficiently well-equipped laboratory can reconstruct data that were overwritten many times. Alternatively, the medium can be sanitized by degaussing it. Degaussing devices are cumbersome, power-hungry devices that are external to the system whose data storage medium is to be sanitized. Degaussing is considered safer than overwriting multiple times but is still not foolproof. The only foolproof way to sanitize a magnetic storage medium is to destroy it physically, which obviously renders the medium no longer useable to store new data.

More recently, a form of EEPROM (electronically erasable programmable read-only memory) non-volatile memory called "flash" memory has come into widespread use. FIG. 1 is a high level schematic block diagram of a generic flash-based data storage device 10 for storing data in one or more flash media 12, for example NAND flash media. The operation of device 10 is controlled by a microprocessor-based controller 14 with the help of a random access memory (RAM) 16 and an auxiliary non-volatile memory 18. Flash device 10 is used by a host device 24 to store data in flash media 12. Flash device 10 and host device 24 communicate via respective communication ports 20 and 26 and a communication link 23. Typically, for backwards compatibility with host devices 24 whose operating systems expect magnetic storage devices, flash device 10 emulates a block memory device, using firmware stored in auxiliary non-volatile memory 18 that implements the methods taught by Ban in U.S. Pat. Nos. 5,404,485 and 5,937,425, both of which patents are incorporated by reference for all purposes as if fully set forth herein.

The "atomic" operations that controller 14 performs on flash media 12 include read operations, write operations and erase operations. One important property of flash media 12 that is relevant to the present invention is that the granularity of the erase operations is larger than the granularity of read and write operations. For example, a NAND flash medium typically is read and written in units called "pages", each of which typically includes between 512 bytes and 2048 bytes, and typically is erased in units called "blocks", each of which typically includes between 16 and 64 pages.

Various US government agencies (primarily military) have defined standards for sanitizing flash media 12. According to DoD 5220.22-M National Industrial Security Program Operating Manual (NISPOM), every byte in flash media 12 is overwritten with the same character, and then flash media 12 are erased. According to National Security Agency (NSA) Manual 130-2, US Air Force System Security Instructions (AFSSI) 5020 and US Navy Staff Office Publication (NAVSO) 5239, "Information System Security Program Guidelines" (INFOSEC), flash media 12 are first erased and then overwritten with random data. According to US Army Regulation 380-19, Information System Security, flash media 12 are first erased and then overwritten twice. In the first overwrite, flash media 12 are overwritten with random data. In the second overwrite, every byte in flash media 12 is overwritten with the same character. Finally, flash media 12 are erased a second time.

SUMMARY OF THE INVENTION

The present invention defines several improvements to the prior art methods of sanitizing flash media and to the flash devices being sanitized. Although the description herein is directed towards the sanitation of flash media, the scope of the present invention extends to all non-volatile data storage media to which the principles of the present invention are applicable.

According to the present invention there is provided a method of cleaning a medium wherein data are stored, the medium including a plurality of blocks and that is only block-wise erasable, each block being bounded by a respective first block boundary and a respective second block boundary, the method including the steps of: (a) selecting a portion of the medium to sanitize, the portion being bounded by a first portion boundary and a second portion boundary, at least one of the portion boundaries being within one of the blocks; (b) for each of the portion boundaries that is within one of the blocks, copying the data, that is stored in the one block outside of the portion, to a second block; and (c) sanitizing every block spanned by the portion.

According to the present invention there is provided a data storage device including: (a) a data storage medium; and (b) a mechanism for sanitizing the data storage medium in response to a single external stimulus.

According to the present invention there is provided a method of cleaning a data storage medium, including the steps of: (a) setting a flag that indicates that the data storage medium is to be sanitized; and (b) subsequent to the setting, beginning a first sanitizing of the data storage medium.

According to the present invention there is provided a data storage device including: (a) a data storage medium; and (b) a controller for sanitizing the data storage medium upon detection of a predetermined condition.

According to the present invention there is provided a method of cleaning a data storage medium, including the steps of: (a) sanitizing the data storage medium; and (b) subsequent to the sanitizing, setting a medium-is-sanitized flag.

According to the present invention there is provided a data storage device including: (a) at least one plurality of data storage media; and (b) a controller for, for each at least one plurality of the data storage media: (i) writing data, substantially simultaneously, to at least a portion of each of the data storage media of the each plurality, and (ii) erasing, substantially simultaneously, at least a portion of each of the data storage media of the each plurality.

According to the present invention there is provided a method of cleaning a data storage device that includes at least one plurality of data storage media, including the steps of: (a) selecting a sanitize procedure, the sanitize procedure including at least one atomic operation; and (b) for each at least one plurality of data storage media: applying the selected sanitize procedure to the data storage media of the each plurality, with each at least one atomic operation being applied substantially simultaneously to the data storage media of the each plurality.

The first improvement of the present invention is directed towards selectively sanitizing only a portion of a flash medium, or more generally, only a portion of a data storage medium that is erased in blocks and that is read and written in units that are smaller than the blocks. Specifically, this method is directed towards sanitizing a portion of the medium, one or both of whose boundaries do not coincide with block boundaries. For each portion boundary that falls between the two boundaries of one of the blocks, the data stored in that block that fall outside the portion to be sanitized first are copied to a second block. Only then are the block or blocks, that are spanned by the portion of the medium to be sanitized, actually sanitized. For this to work, the second block must be outside (i.e., not spanned by) the portion to be sanitized.

Preferably, the second block is itself sanitized before the data from just beyond the portion to be sanitized are copied to the second block.

Preferably, at least one free block that is outside the portion to be sanitized also is sanitized.

The second improvement of the present invention is a data storage device that includes a (preferably non-volatile) data storage medium and a mechanism for sanitizing the data storage medium in response to a single external stimulus, as opposed to, for example, a sequence of several commands from host device 24 that instruct controller 14 to implement one of the sanitization standards discussed above. Although these standards have been in use at least since 1990, such a data storage device has not been implemented heretofore.

According to one aspect of the second improvement, the mechanism includes an interface to a host system, and the external stimulus is a single "sanitize" command from the host system.

According to another aspect of the second improvement, the mechanism includes an interrupt handler, and the external stimulus is a hardware interrupt. To this end, the data storage device also includes an interrupt initiator for providing the hardware interrupt. Preferably, the interrupt initiator includes a wireless transmitter for transmitting the hardware interrupt, and the interrupt handler includes a wireless receiver for receiving the transmitted hardware interrupt.

The third improvement of the present invention is a method of sanitizing a data storage medium that can be restarted after being interrupted, for example by a power failure. Before starting a first sanitizing of the data storage medium, a flag is set that indicates that the data storage medium is to be sanitized. Upon completion of the first sanitizing, the flag is cleared.

Preferably, before the beginning of the first sanitizing, at least one sanitizing parameter is stored. Upon completion of the first sanitizing, the at least one parameter is erased.

When the data storage medium is powered up, the flag is checked. If the flag is set, indicating that the first sanitizing was interrupted, a second sanitizing of the data storage medium is begun. Upon completion of the second sanitizing, the flag is cleared. Preferably, if the at least one sanitizing parameter was stored before beginning the first sanitizing, then upon completion of the second sanitizing, the at least one sanitizing parameter is erased.

The fourth improvement of the present invention is a data storage device that supports conditional sanitization. The device includes a (preferably non-volatile) data storage medium and a controller for sanitizing the data storage medium upon detection of a predetermined condition.

Preferably, the condition is a physical condition, such as an interruption of power or an improper shutdown, or else a logical condition. Preferably, the logical condition is an indication that an unauthorized access of the data storage medium has been attempted. One example of such a logical condition is more than a predetermined number of accesses (e.g., reads or writes) to a preselected datum, for example a FAT table entry, that is stored in the data storage medium. Another example of such a logical condition is more than a predetermined number of accesses (e.g., reads, writes or erases) to a preselected portion of the data storage medium.

The fifth improvement of the present invention is a method of sanitizing a data storage medium that supports the provision of a "death certificate" for the sanitized medium. A "medium is sanitized" flag is set after the data storage medium is sanitized. Once the flag has been set, it can be verified that the data storage medium has been sanitized by checking that the flag is indeed set. Preferably, the verifying also includes checking at least a portion of the data storage medium for a data pattern stored therein (including "no data" if the last step of the sanitizing process was an erase) that indicates that the data storage medium has been sanitized. Most preferably, the entire data storage medium is checked for a data pattern stored therein that indicates that the data storage medium has been sanitized.

Preferably, if the verifying determines that the data storage medium has in fact been sanitized, a death certificate for the data storage medium is issued. Most preferably, the death certificate is based on a verification seed and on a serial number of the data storage device that includes the data storage medium.

The sixth improvement of the present invention is a data storage device that supports parallel sanitizing, and a method of sanitizing the device.

The device includes at least one plurality, and preferably more than one plurality, of data storage media, and a controller for writing data, substantially simultaneously, to at least a portion of each data storage medium of each plurality, and for erasing, substantially simultaneously, at least a portion of each data storage medium of each plurality. Note that all of the sanitization standards discussed above include both writes and erases. Preferably, the device also includes, for each plurality of data storage media, at least one respective bus that operationally connects the data storage media of the plurality to the controller.

Preferably, the data storage media are non-volatile. Most preferably, the data storage media are NAND flash chips.

Preferably, the data storage media are page-wise writable. Preferably, the portion of each data storage medium to which data are written during a substantially simultaneous write is a single page of the data storage medium. Alternatively, the portion of each data storage medium to which data are written during a substantially simultaneous write is a plurality of pages of the data storage medium. Another alternative is to write the data to all of each data storage medium of the plurality, i.e., to every page of each data storage medium of the plurality, not just to portions of the data storage media, during a substantially simultaneous write.

Preferably, the data storage media are block-wise erasable. Preferably, the portion of each data storage medium that is erased during a substantially simultaneous erase is a single block of the data storage medium. Alternatively, the portion of each data storage medium that is erased during a substantial simultaneous erase is a plurality of blocks of the data storage medium. Another alternative is to erase all of each data storage medium of the plurality, i.e., to erase every block of each data storage medium, not just portions of the data storage media, during a substantially simultaneous erase.

The method of the sixth improvement has two steps. In the first step, a sanitize procedure for the data storage device is selected. This procedure includes at least one atomic operation. Typically, as in the sanitize standards discussed above, the atomic operations are writes and erases, although the procedure could include reads, for example if the procedure is directed at only a portion of each data storage medium. In the second step, the procedure is applied to the data storage media, with each atomic operation being applied substantially simultaneously to the data storage media of each plurality of data storage media.

The substantially simultaneous atomic operation may be a substantially simultaneous write of data to a single page of each data storage medium of a plurality of data storage media, a substantially simultaneous write of data to a plurality of pages of each data storage medium of a plurality of data storage media, or a substantially simultaneous write of data to all (i.e., to every page) of each data storage medium of a plurality of data storage media. The substantially simultaneous atomic operation may be a substantially simultaneous erase of a single block of each data storage medium of a plurality of data storage media, a substantially simultaneous erase of a plurality of blocks of each data storage medium of a plurality of data storage media, or a substantially simultaneous erase of all (i.e., of every block) of each data storage medium of a plurality of data storage media.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of improved methods of sanitizing data storage media, and of data storage devices that support these methods. Specifically, the present invention can be used to sanitize flash-based data storage media such as NAND flash chips.

The principles and operation of data storage media sanitization according to the present invention may be better understood with reference to the drawings and the accompanying description.

Figure 1:
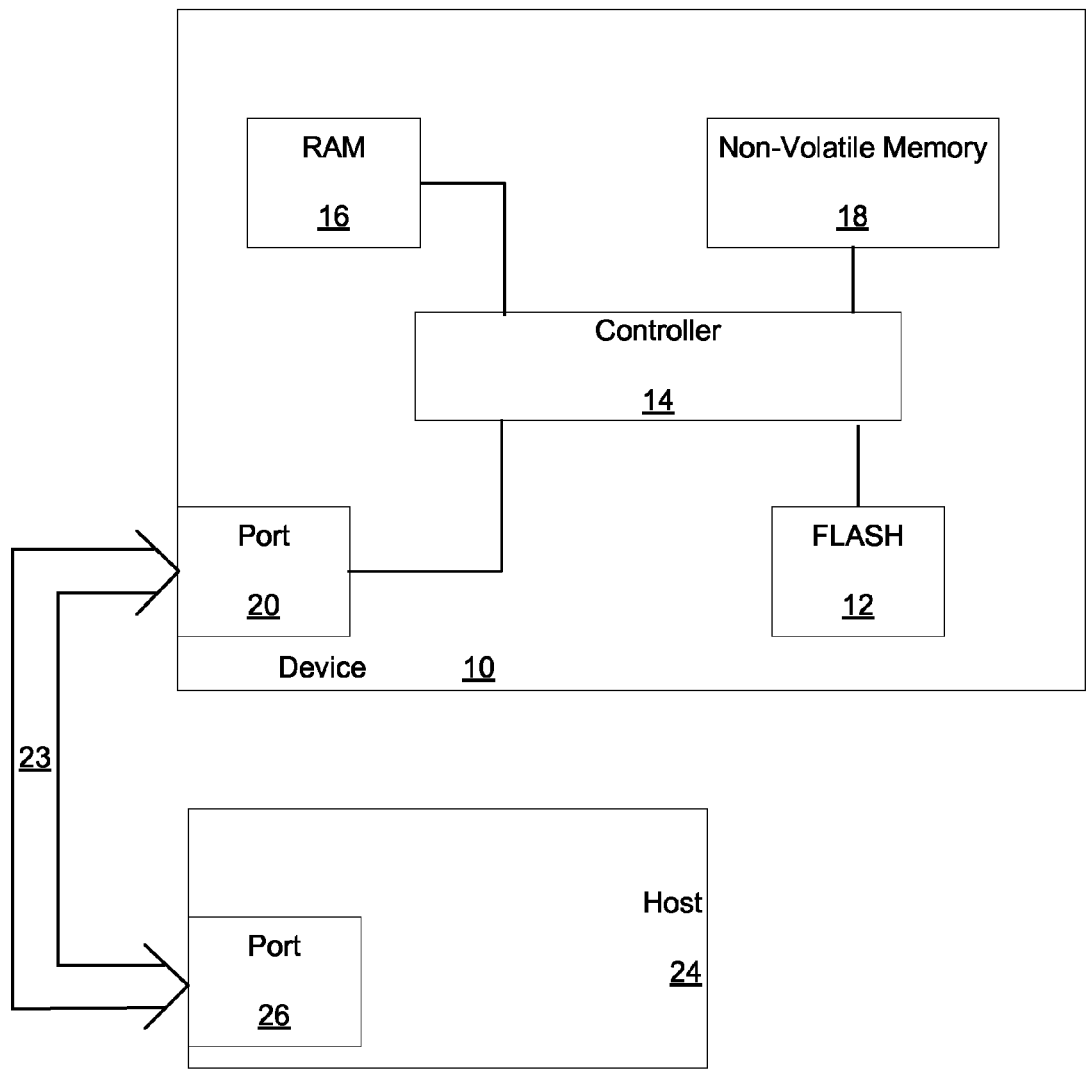
FIG. 1 is a high level schematic block diagram of a prior art flash-based data storage device coupled to a host device.
Figure 2:
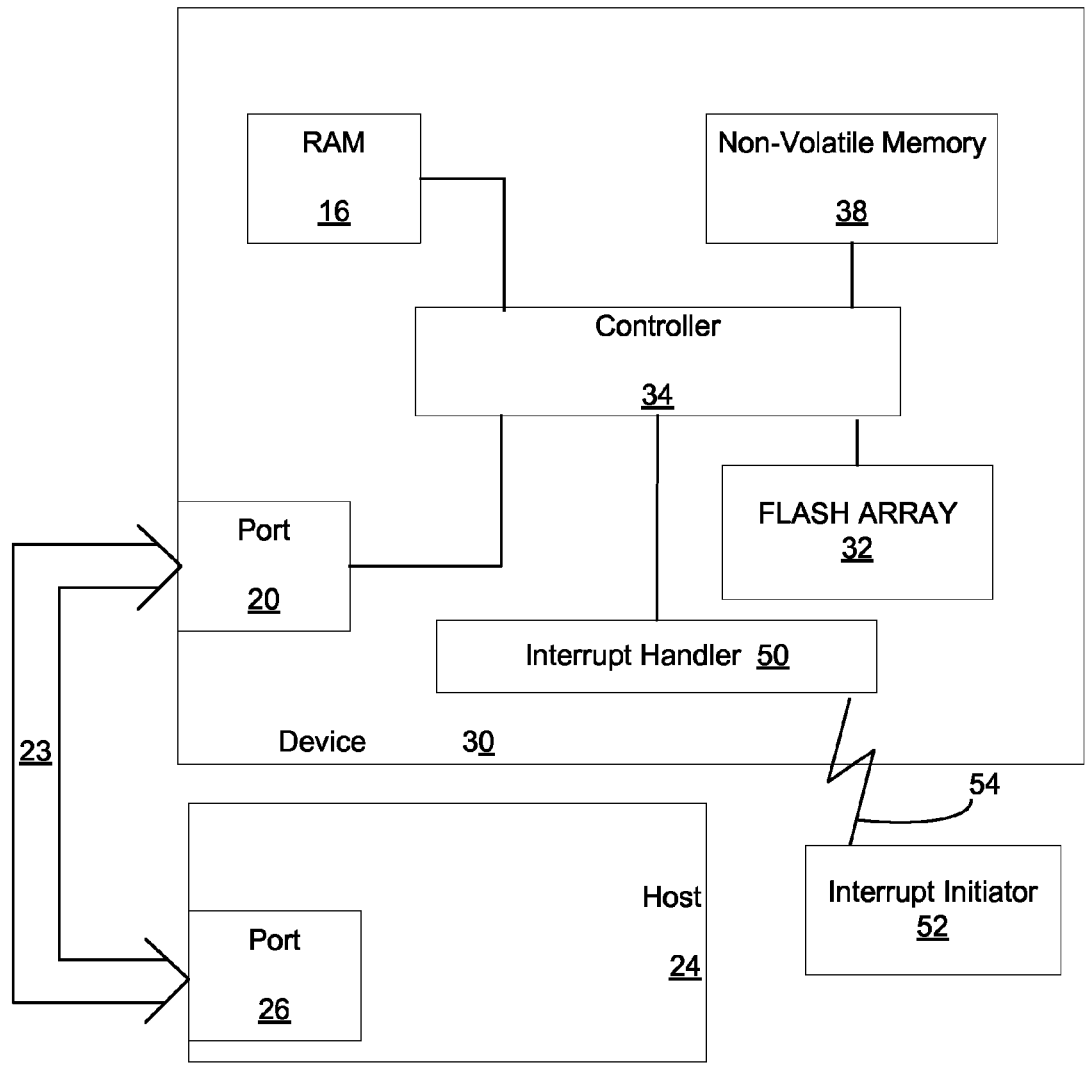
FIG. 2 is a high level schematic block diagram of a flash-based data storage device of the present invention coupled to the host device of FIG. 1.

Referring again to the drawings, FIG. 2 is a high-level schematic block diagram of a flash-based data storage device 30 of the present invention, coupled to host device 24 of FIG. 1. Most of the high level components of device 30 are the same as in prior art device 10, although the controller and the auxiliary non-volatile memory of device 30 are given different reference numerals (34 and 38 respectively) to indicate that these components are different functionally, if not structurally, from controller 14 and auxiliary non-volatile memory 18 of device 10. Controller 34 and auxiliary non-volatile memory 38 have all the functionality of prior art controller 14 and prior art auxiliary non-volatile memory 18, and also functionality of the present invention, as discussed below.

Figure 3:
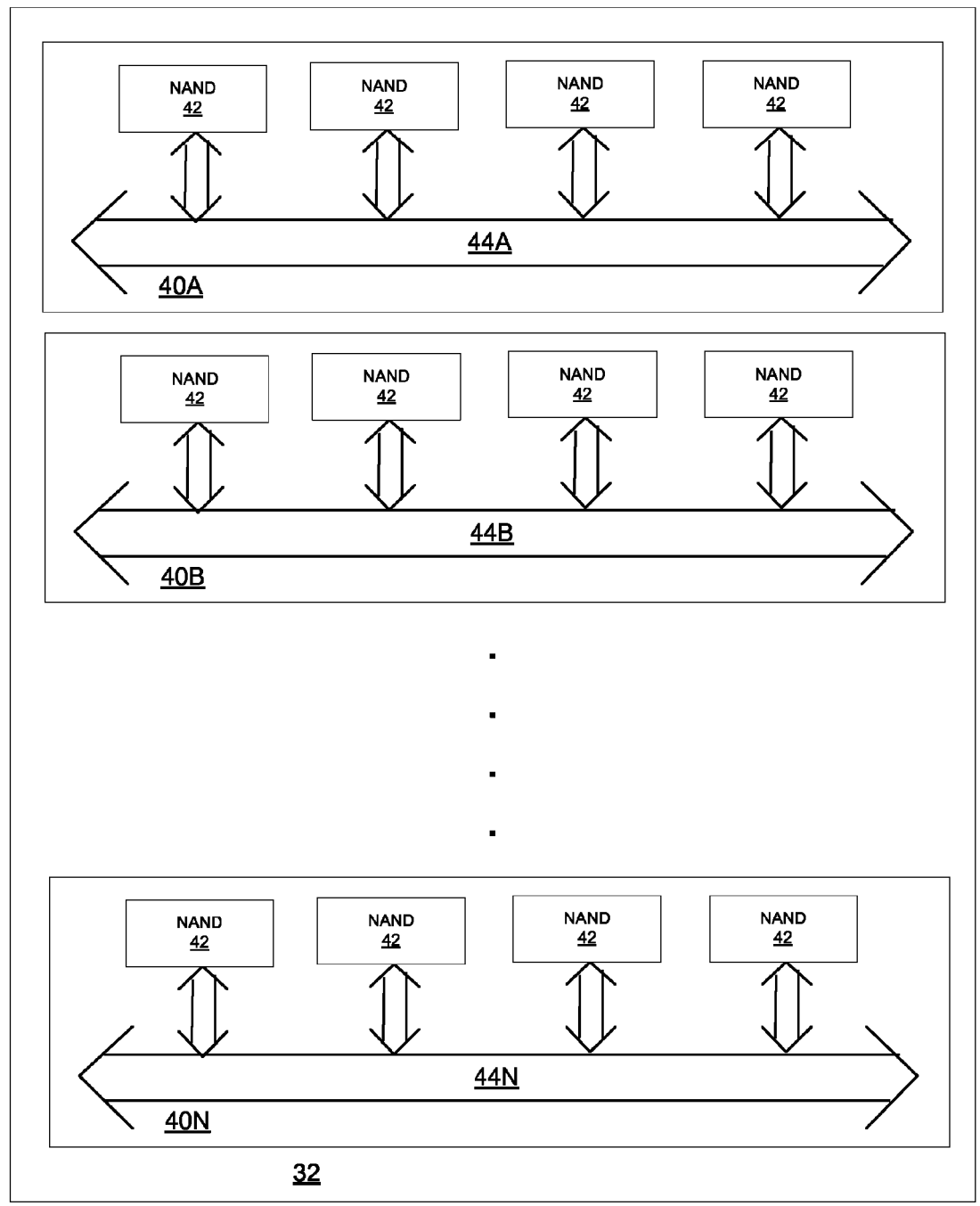
FIG. 3 shows the internal structure of the flash array of the data storage device of FIG. 2.

In place of flash media 12, device 30 is shown as including a flash array 32 that is illustrated in more detail in FIG. 3. Flash array 32 includes several subarrays 40A through 40N of NAND flash chips 42. Each subarray 40 includes the same number (between 2 and 64) of NAND flash chips 42. In the illustrated example, each subarray 40 includes four NAND flash chips 42. NAND flash chips 42 of each subarray 40 communicate with controller 34 via a corresponding set 44 of buses, either four 32-bit buses or two 64-bit buses per set.

Figure 4:
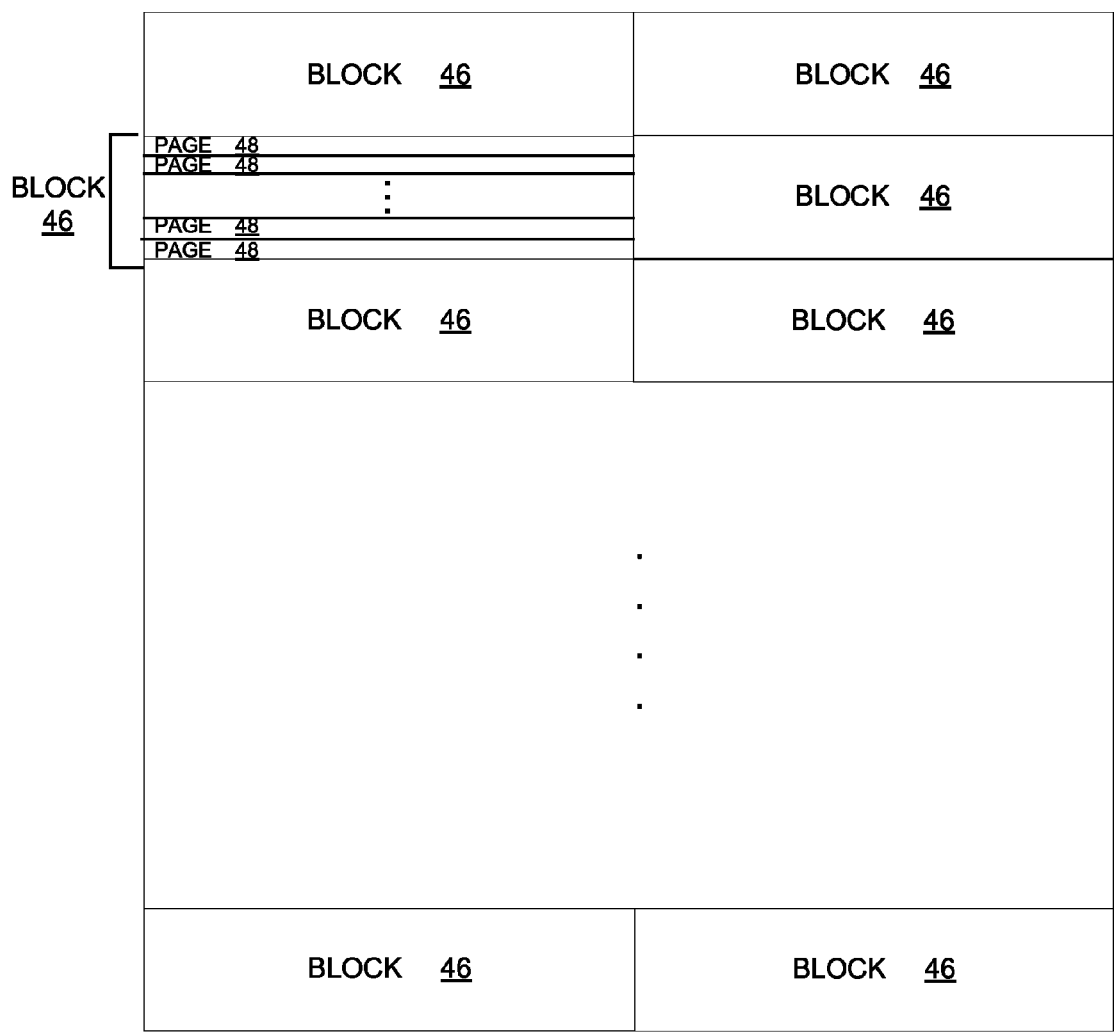
FIG. 4 shows the internal partition into blocks and pages of a NAND flash chip of the flash array of FIG. 3.

For reference, FIG. 4 shows the structure of a NAND flash chip 42. NAND flash chip 42 includes between 1024 and 8192 blocks 46. Every NAND flash chip 42 of a particular subarray 40 includes the same number of blocks 46. Every block 46 includes the same number of pages 48, either 16 pages 48 per block 46, 32 pages 48 per block 46 or 64 pages 48 per block 46. Every page 48 includes the same number of bytes, which number could be any multiple of 512 between 512 and 2048. As described above, the erasable units of NAND flash chip 42 are blocks 46 and the readable and writable units of NAND flash chip 42 are pages 48.

Typical NAND flash chips 42 support one or both of two kinds of erase commands. A block erase command erases a designated block 46. A multi-block erase command erases a designated group of blocks 46, typically four blocks 46. Similarly, typical NAND flash chips 42 support one or both of two kinds of write commands. A page write command writes one page worth of data from RAM 16 (used as a buffer) to a designated page of a designated block 46. A multi-page write command writes several pages, typically four pages, worth of data from RAM 16 to several designated pages of a designated block 46.

While a NAND flash chip is executing an erase or write command, the NAND flash chip sets its status to "busy". Upon completing the execution of the command, the NAND flash chip sets its status to "ready". According to the prior art, when prior art flash media 12 are NAND flash chips, after prior art controller 14 issues a write or erase command to any particular NAND flash chip, prior art controller 14 waits for that NAND flash chip's status to change from "busy" to "ready" before issuing the next command of the same type (erase or write). The architecture of flash array 32, as illustrated in FIG. 3, allows enhanced parallelism in sanitizing flash array 32. Specifically, within each subarray 40, controller 34 issues, via buses 44, successive erase or write commands to all NAND flash chips 42 of that subarray 40, without waiting for any NAND flash chip 42 to transit from "busy" status to "ready" status before issuing the erase or write command to the next NAND flash chip 42. In this manner, all NAND flash chips 42 of a subarray 40 are erased, or written to, substantially simultaneously. As a result, with N NAND flash chips 42 per subarray 40, sanitizing flash array 32 is almost N times faster than sanitizing comparable prior art flash media 12.

For example, sanitizing flash array 32 according to the NISPOM standard includes two phases, a write phase and an erase phase. For definiteness, this example uses page write and block erase commands.

In the write phase, one page's worth of the overwrite character is loaded into a one-page-long buffer in RAM 16. The remainder of the phase consists of four nested loops: an outer loop, an intermediate loop within the outer loop, and two inner loops within the intermediate loop. The outer loop is over page number. The intermediate loop is over subarrays 40. The first inner loop is over NAND flash chips 42 of the current subarray 40: in each cycle of the loop, controller 34 issues a page write command to copy the buffer in RAM 16 to the current page 48 of the current NAND flash chip 42, without having waited for the immediately preceding NAND flash chip 42 to enter "ready" status. The second inner loop also is over NAND flash chips 42 of the current subarray 40: in each cycle of the loop, controller 34 inspects the status of the current NAND flash chip 42. The second inner loop is repeated until all NAND flash chips 42 of the current subarray 40 are in "ready" status.

The erase phase also has four nested loops: an outer loop, an intermediate loop within the outer loop, and two inner loops within the intermediate loop. The outer loop is over block number. The intermediate loop is over subarrays 40. The first inner loop is over NAND flash chips 42 of the current subarray 40: in each cycle of the loop, controller 34 issues a block erase command to erase the current block 46 of the current NAND flash chip 42, without having waited for the immediately preceding NAND flash chip 42 to enter "ready" status. The second inner loop also is over NAND flash chips 42 of the current subarray 40: in each cycle of the loop, controller 34 inspects the status of the current NAND flash chip 42. The second inner loop is repeated until all NAND flash chips 42 of the current subarray 40 are in "ready" status.

Sanitizing flash array 32 with multi-page write commands and multi-block erase commands is similar, with the outer loops being over groups of pages 48 and blocks 46 instead of over individual pages 48 and blocks 46.

NOR flash chips support, in addition to block erase page write commands, chip erase commands that erase entire chips, not just individual blocks/pages. It is expected that NAND flash chips soon will be available that support both such chip erase commands and also chip write commands that write entire chips; and that NOR flash chips also soon will be available that support both chip erase commands and chip write commands. When such NAND flash chips are available, sanitizing flash array 32 still will be as described above, except that there will be no outer loops over (groups of) pages or over (groups of) blocks.

Returning to FIG. 2, device 30 also includes an interrupt handler 50, which is shown separate from controller 34 but which alternatively could be integrated in controller 34. A user of device 30 initiates sanitizing of flash array 32 by using an interrupt initiator 52 to signal interrupt handler 50. This signal is a hardware interrupt that causes controller 34 to immediately stop whatever activity controller 34 is currently engaged in and to start sanitizing flash array 32. In one preferred embodiment of device 30, interrupt initiator 52 is an electrical switch that is operated manually by the user and that is connected to interrupt handler 50 by wires. In another preferred embodiment of device 30, interrupt initiator 52 is an electrical system that automatically initiates sanitizing of flash array 32 in an emergency. In yet another preferred embodiment of device 30, which is the embodiment actually illustrated in FIG. 2, interrupt initiator 52 is a manually or automatically operated transmitter of wireless electromagnetic signals and interrupt handler 50 is a receiver of those signals. Interrupt initiator 52 transmits an appropriate electromagnetic signal 54 to interrupt handler 50 to initiate sanitizing of flash array 32. Suitable communication standards for interrupt initiator 52 and interrupt handler 50 in this preferred embodiment include Bluetooth for radio frequency signals and IrDA for infrared signals.

More generally, according to the present invention, sanitizing of flash array 32 is initiated by a single external stimulus. The hardware interrupt initiated by interrupt initiator 52 is one example of such an external stimulus. Another example of such an external stimulus is a software interrupt in the form of a "sanitize" command received by controller 34 from host 24. This is in contrast to the prior art of FIG. 1, in which host 24 must send to device 10 the explicit sequence of write and erase commands that sanitize flash media 12. Although the various standards described above for sanitizing flash media 12 have been in use since 1990, the data storage device of the present invention is the first such data storage device whose data storage medium can be sanitized in response to a single external stimulus.

To enable sanitizing of flash array 32 in response to a hardware interrupt, parameters that describe a default sanitize method (either one of the standard methods described above or a user-defined method) are stored in non-volatile memory 38. When interrupt handler 50 receives the hardware interrupt signal, controller 34 reads these parameters from non-volatile memory 38 and proceeds accordingly. In the case of a sanitize initiated by a software interrupt, the sanitize command from host 24 optionally is optionally accompanied by sanitize parameters that override the default sanitize parameters that are stored in non-volatile memory 38.

Controller 34 also sanitizes flash array 32 upon detection of a predetermined condition. This condition may be either a physical condition or a logical condition.

One typical physical condition is an interruption of power that is detected by a reset chip (not shown) in device 30. Upon detection of the interruption of power, the reset chip initiates an interrupt via interrupt handler 50. Controller 34 then sanitizes flash array 32 either upon the next power-up or, alternatively, immediately using a back-up power source (not shown). Another typical physical condition is an improper shutdown of device 30.

The logical condition typically is a condition that suggests an attempted unauthorized access of the data stored in flash array 32. One example of such a logical condition is that a predetermined datum, such as a FAT table entry, has been accessed (read and/or written) more than a predetermined number of times. Another example of such a logical condition is that a predetermined portion, such as a particular page 48 or block 46, of flash array 32 has been accessed (read, written or erased) more than a predetermined number of times.

Optionally, a wireless interrupt initiator 52 and interrupt handler 50 are configured to enable a user, not just to initiate the sanitizing of flash array 32, but to handle all aspects of the sanitizing of flash array 32. For example, a suitably configured interrupt initiator 52 and interrupt handler 50 can be used to set the default sanitize parameters, to override the default sanitize parameters, or to interrogate the sanitize status (sanitize not started, sanitize in progress or sanitize completed) of device 30.

Another important aspect of the present invention is the ability to sanitize only a selected part of flash array 32, at a granularity finer than the level of blocks 46. This ability relies on the methodology for managing flash data storage media that is taught in U.S. Pat. Nos. 5,404,485 and 5,937, 425. According to this prior art methodology, controller 34 maintains a table, either in RAM 16 or in non-volatile memory 18 or even (see U.S. Pat. No. 5,404,485) in flash array 32 itself, that maps logical blocks and logical pages addressed by host 24 into the physical blocks and physical pages in flash array 32 in which data actually are stored. For example, a page 48 of a NAND flash chip 42 can be written to only a small (typically 3 to 10) number of times before that page must be erased in order to be rewritten. Therefore, it often happens that in order to replace a page 48 of old data with new data, controller 34 copies all the data stored in the physical block 46 in which the target page 48 is located, except for the data in the target page 48, to all but one of the pages 48 a so-called "free" block, i.e., a physical block 46 that has not been written to since the last time it was erased, and writes the new data to the remaining page 48 of the new block 46. Meanwhile, the table that maps logical blocks and pages to physical blocks and pages is updated so that the logical blocks and pages that were associated with the old physical block 46 and its pages 48 now are associated with the new physical block 46 and its pages 48. This all is totally transparent to host 24. As far as host 24 is concerned, the new data were written to the same (logical) page as the old data.

It now will be explained how this methodology is used to facilitate partial sanitizing at a finer granularity than the level of physical blocks 46. For this purpose, the notation (b,p) is used to represent the p-th page 48 of the b-th block 46, and the notation (b,) is used to represent the b-th block 46. It is assumed that every block 46 has P pages 48, indexed 0 through P−1.

Suppose that it is desired to sanitize pages (b.sub.i,p.sub.i) through (b.sub.f,p.sub.f), where b.sub.i.ltoreq.b.sub.f. (The subscript "i" means "initial". The subscript "f" means "final".) If p.sub.i=0 and p.subS=P−1, then all that is necessary is to sanitize blocks (b.sub.i,) through (b.sub.f,) according to the standards described above, which include erasures of entire blocks 46, because the boundaries of the portion of flash array 32 that is to be sanitized coincide with block boundaries: the initial boundary of the first page to be sanitized coincides with the initial boundary of the first block and the final boundary of the last page to be sanitized coincides with the final boundary of the last block. But if p.sub.i>0, then the initial boundary of the first page to be sanitized falls between the two boundaries of the first block, and the data in pages (b.sub.i,0) through (b.sub.i,p.sub.i−1) must be preserved. Similarly, if p.sub.f<P−1 then the final boundary of the last page to be sanitized falls between the boundaries of the last block, and the data in pages (b.sub.f, p.sub.f+1) through (b.sub.f,P−1) must be preserved.

Therefore, if p.sub.i>0, pages (b.sub.i,0) through (b.sub.i, p.sub.i−1) first are copied to a free block 46. Similarly, if p.sub.f<P−1, pages (b.sub.f,p.sub.f+1) through (b.sub.f,P−1) first are copied to a free block 46. Only then are blocks (b.sub.i,) through (b.sub.f,), that span the targeted portion of flash array 32, sanitized. Most preferably, the free block 46 to which pages (b.sub.i,0) through (b.sub.i,p.sub.i−1) are copied is itself sanitized before the pages are copied, and the free block 46 to which pages (b.sub.f,p.sub.f+1) through (b.sub.f,P−1) are copied is itself sanitized before the pages are copied. Also most preferably, after blocks (b.sub.i,) through (b.sub.f,) are sanitized, all the remaining free blocks also are sanitized, to make sure that any nominally free blocks that contain out-of-date or superceded classified data are sanitized. Finally, the table that maps logical blocks and pages to virtual blocks and pages is updated to reflect the new physical locations of the data formerly stored in physical pages (b.sub.i,0) through (b.sub.i,p.sub.i−1) and/or in physical pages (b.sub.f,p.sub.f+1) through (b.sub.f,P−1).

Another important aspect of the present invention is the ability to complete a sanitizing that was interrupted by, for example, a power failure. To this end, before starting to sanitize flash array 32, controller 34 sets, in non-volatile memory 38, a "sanitize-on" flag that indicates that flash array 32 is to be sanitized. If the sanitize was initiated by a software interrupt accompanied by sanitize parameters that override the default sanitize parameters, controller 34 also stores these new sanitize parameters in non-volatile memory 38, separately from the default sanitize parameters.

Controller 34 then starts to sanitize flash array 32. After flash array 32 has been sanitized, controller 34 clears the sanitize-on flag. If the default sanitize parameters were overridden, controller 34 also erases the new sanitize parameters.

Whenever device 30 is powered up, controller 34 is the sanitize-on flag. If the sanitize-on flag is set, that indicates that a sanitize of flash array 32 has been interrupted. Controller 34 therefore starts to sanitize flash array 32, in accordance with the relevant sanitize parameters stored in non-volatile array 38. After flash array 32 has been sanitized, controller 34 clears the sanitize-on flag. If the default sanitize parameters were overridden, controller 34 also erases the new sanitize parameters.

The above description applies to resumption of an interrupted sanitize of all of flash array 32. An interrupted partial sanitize of flash array 32 also can be resumed, using techniques adapted from Lasser et al., U.S. Pat. No. 6,977,847, which is incorporated by reference for all purposes as if fully set forth herein. Note that some of these techniques require modification of NAND flash chips 42.

After flash array 32 has been sanitized, controller 34 also sets, in non-volatile memory 38, a "medium-is-sanitized" flag that remains set until the next time that data are written to flash array 32. The presence of this medium-is-sanitized flag allows the fact that flash array 32 has been sanitized to be verified: if the medium-is-sanitized flag is set, then flash array 32 has been sanitized, and if the medium-is-sanitized flag is not set, then flash array 32 has not been sanitized.

Optionally, a verification level parameter is stored in non-volatile memory 38. The values of this verification level parameter are indicative of one of three different verification levels:

Level 1: check only the medium-is-sanitized flag, as described above.

Level 2: as in level 1, but also check a predetermined portion of flash array 32, for example the first page 48 of every block 46, for the presence of the data pattern that would be expected therein if those pages 48 actually have been sanitized. For example, if flash array 32 was sanitized according to the standard of US Army Regulation 380-19, every byte of those pages 48 should contain the same character.

Level 3: as in level 2, but check all of flash array 32 for the presence of the expected data pattern.

Optionally, a sanitize-verification-seed parameter is used to compute a "death certificate" for device 30. This parameter is either stored in non-volatile memory 38 or received from the external device (host 24 or a suitably configured wireless interrupt initiator 52) that requests the verification of the sanitizing of flash array 32. If, as checked according to the verification level determined by the verification level parameter, flash array 32 indeed has been sanitized, then a "death certificate" is computed, from the sanitize-verification seed and from the serial number of device 30 (which also is stored in nonvolatile memory 38), using a secret algorithm that is pre-defined by the user. The death certificate then is transmitted to the external device that requested the verification.

While the invention has been described with respect to a limited number of embodiments, it will be appreciated that many variations, modifications and other applications of the invention may be made.

What is claimed is:

1. A computer implemented method for sanitizing a storage device, comprising:
    receiving a sanitize command to sanitize at least a portion of a data storage medium within the storage device, wherein the data storage medium includes a plurality of sub-arrays each having a plurality of storage chips and the portion of the data storage medium includes storage chips from the plurality of sub-arrays;
    performing the sanitizing of the plurality of storage chips within the plurality of sub-arrays forming the portion of the data storage medium within the storage device, in response to the sanitize command, the sanitizing executing a sanitize method, wherein the sanitizing is performed in parallel on each of the plurality of storage chips within the plurality of sub-arrays defined in the portion of the data storage medium, the sanitize method defined by one or more sanitize parameters, wherein the sanitize parameters are identified based on the sanitize command;
    wherein when an unexpected power interruption occurs during performance of the sanitizing of the storage device,
        determining sanitize status of the plurality of storage chips within the plurality of sub-arrays upon powering up the storage device after the unexpected power interruption; and
        resuming the sanitizing of the portion of the data storage medium within the storage device, wherein the storage device is a non-volatile storage device.

2. The computer implemented method of claim 1, wherein performing the sanitizing further includes,
    setting a sanitize flag indicative of a sanitize status of the storage device; and
    saving at least one sanitize parameter associated with the storage device,
    wherein the setting of the sanitize flag and saving of sanitize parameter are performed prior to the sanitizing of the storage device.

3. The computer implemented method of claim 2, wherein determining sanitize status further includes,
    interrogating the sanitize flag of the storage device, the sanitize flag defining the sanitize status associated with the sanitizing of each of the plurality of storage chips in the plurality of sub-arrays of the storage device, wherein information provided in the sanitize flag is used for
    restarting the sanitizing of the storage chips in each of the plurality of sub-arrays forming the portion of the data storage medium within the storage device from a point of interruption.

4. The computer implemented method of claim 2, further includes resetting the sanitize flag and erasing the at least one sanitize parameter upon successful completion of the sanitizing of the storage device.

5. A computer implemented method for sanitizing a storage device, comprising:
    determining sanitize status associated with the sanitizing of the storage device upon powering up of the storage device, wherein the storage device includes a plurality of sub-arrays each having a plurality of storage chips, the sanitize status determined by,
    interrogating a sanitize flag associated with each of the plurality of storage chips in each of the plurality of sub-arrays of the storage device, upon powering up of the storage device, wherein the sanitize flag is indicative of sanitize status of each of the plurality of storage chips and is determined by checking a predetermined portion of the respective storage chips for presence of a particular data pattern;
    resuming the sanitizing of the plurality of storage chips within the plurality of sub-arrays of the storage device in accordance to sanitize parameters for the storage device, when the sanitize flag of any one or more of the plurality of storage chips indicates an interruption in the sanitizing of the storage device,
    wherein the storage device is a non-volatile storage device.

6. The computer implemented method of claim 5, wherein the sanitize flag associated with each of the plurality of storage chips is stored in the non-volatile storage device.

7. The computer implemented method of claim 5, wherein resuming the sanitizing further includes clearing the sanitize flag associated with each of the plurality of storage chips in each of the plurality of sub-arrays, after successful sanitizing of the plurality of storage chips of the storage device.

8. The computer implemented method of claim 5, further includes adjusting the sanitize flag to reflect successful sanitizing of the storage device, upon successfully completing sanitizing of the storage device.

9. The computer implemented method of claim 5, wherein the sanitizing of the storage device is performed upon detection of a predetermined condition, wherein the predetermined condition is one of a physical condition or a logical condition.

10. The computer implemented method of claim 5, further includes verifying successful completion of sanitizing of the storage device based on a verification level parameter defined for the storage device, the verification level parameter identifying a value that is indicative of level of verification to be performed for verifying successful completion of the sanitizing of the storage device.

11. The computer implemented method of claim 10, wherein the level of verification to be performed at the storage device to determine the successful sanitizing includes any one of, (a) interrogating the sanitize flag associated with each of the storage chips in the plurality of sub-arrays of the storage device;

(b) checking a predetermined portion of the plurality of sub-arrays of the storage device for presence of a data pattern indicative of successful sanitizing of each of the storage chips disposed therein, in addition to the interrogation of the sanitize flag associated with each of the storage chips in the plurality of sub-arrays of the storage device; and (c) checking each of the plurality of the sub-arrays of the storage device for presence of a data pattern indicative of successful sanitizing of each of the storage chips disposed therein, in addition to the interrogation of the sanitize flag associated with each of the storage chips in the plurality of sub-arrays of the storage device.

12. A data storage device comprising:

a data storage medium;

a controller for performing sanitizing of at least a portion of the data storage medium in response to a sanitize command received from a host system, wherein the data storage medium includes a plurality of sub-arrays each having a plurality of storage chips and the portion of the data storage medium includes storage chips from one or more of the plurality of sub-arrays, wherein the controller is configured to, (a) determine sanitize status associated with the sanitizing of the portion of the storage medium upon powering up of the storage device, the sanitize status determined by interrogating a sanitize flag associated with each of the plurality of storage chips within each of the plurality of sub-arrays forming the portion of the data storage medium, wherein the sanitize flag is indicative of sanitize status of each of the plurality of storage chips and is determined by checking a predetermined portion of each of the plurality of storage chips in each of the plurality of sub-arrays forming the portion of the data storage medium for presence of a particular data pattern;

(b) resume the sanitizing of the plurality of storage chips within the plurality of sub-arrays forming the portion of the data storage medium based on the sanitize status of the storage device; and (c) verify successful sanitizing of the portion of the data storage medium based on a verification level parameter defined for the data storage medium, the verification level parameter identifying a value that is indicative of a level of verification to be performed at the data storage medium to verify successful completion of the sanitizing.

13. The data storage device of claim 12, wherein the controller is further configured to adjust the sanitize flag to reflect current sanitizing status of the portion of the data storage medium of the storage device, upon successful completion of sanitizing of the storage device.

14. The data storage device of claim 12, wherein based on the value defined in the verification level parameter, the controller is further configured to perform any one of, (a) interrogating the sanitize flag associated with each of the plurality of storage chips in each of the plurality of sub-arrays forming the portion of the data storage medium;

(b) checking a predetermined portion of the plurality of sub-arrays of the data storage medium of the storage device for presence of a data pattern indicative of successful sanitizing of each of the storage chips disposed therein, in addition to the interrogation of the sanitize flag associated with each of the plurality of storage chips in the plurality of sub-arrays forming the portion of the data storage medium; and (c) checking each of the plurality of the sub-arrays of the storage device for presence of a data pattern indicative of successful sanitizing of each of the storage chips disposed therein, in addition to the interrogation of the sanitize flag associated with each of the storage chips in the plurality of sub-arrays of the storage device.

15. The data storage device of claim 12, wherein the controller is configured to perform the sanitizing of the storage device upon detecting a predetermined condition, wherein the predetermined condition is one of a physical condition or a logical condition.

* * * * *